US011625297B2

(12) United States Patent
Kwon et al.

(10) Patent No.: US 11,625,297 B2
(45) Date of Patent: Apr. 11, 2023

(54) STORAGE DEVICE AND OPERATING METHOD THEREOF

(71) Applicant: Samsung Electronics Co., Ltd., Suwon-si (KR)

(72) Inventors: Jea-Young Kwon, Hwaseong-si (KR); Young-Jin Park, Suwon-si (KR); Jae-Kun Lee, Suwon-si (KR); Song Ho Yoon, Yongin-si (KR); Sil Wan Chang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/352,861

(22) Filed: Jun. 21, 2021

(65) Prior Publication Data
US 2022/0066872 A1 Mar. 3, 2022

(30) Foreign Application Priority Data

Aug. 28, 2020 (KR) .................. 10-2020-0109357
Dec. 16, 2020 (KR) .................. 10-2020-0176470

(51) Int. Cl.
*G06F 11/10* (2006.01)
*G06F 3/06* (2006.01)
*G06F 11/07* (2006.01)
*G06F 11/14* (2006.01)

(52) U.S. Cl.
CPC ........ *G06F 11/1068* (2013.01); *G06F 3/0619* (2013.01); *G06F 3/0659* (2013.01); *G06F 3/0679* (2013.01); *G06F 11/076* (2013.01); *G06F 11/0772* (2013.01); *G06F 11/1417* (2013.01)

(58) Field of Classification Search
CPC ............ G06F 11/1068; G06F 11/0772; G06F 11/1076; G06F 3/0619; G06F 3/0659; G06F 3/0679; G06F 11/1004
See application file for complete search history.

(56) References Cited

U.S. PATENT DOCUMENTS 7,679,133 B2    3/2010  Son et al.
8,553,466 B2   10/2013  Han et al.
8,559,235 B2   10/2013  Yoon et al.
(Continued)

FOREIGN PATENT DOCUMENTS

EP        1043729 A2     10/2000
KR     20180031289 A      3/2018

OTHER PUBLICATIONS

European Search Report dated Jan. 28, 2022 corresponding to EP Patent Application No. 21 193 140.7.
(Continued)

*Primary Examiner* — Shelly A Chase
(74) *Attorney, Agent, or Firm* — Harness, Dickey & Pierce, P.L.C.

(57) ABSTRACT

A storage device is provided. The storage device includes a memory device including a memory cell array configured to store metadata and main data and a storage controller configured to access the memory device and control the memory device, wherein the storage controller is configured to read data from the memory device at a speed adaptively varying to a first read speed or a second read speed according to a state of the memory device, the second read speed being faster than the first read speed.

20 Claims, 8 Drawing Sheets

(56) References Cited

U.S. PATENT DOCUMENTS

| | | |
|---|---|---|
| 8,654,587 B2 | 2/2014 | Yoon et al. |
| 8,850,103 B2 | 9/2014 | Bennett |
| 8,898,543 B2 | 11/2014 | Jo et al. |
| 10,381,097 B2 | 8/2019 | Yang et al. |
| 10,732,898 B2 | 8/2020 | Shi et al. |
| 2011/0233648 A1 | 9/2011 | Seol et al. |
| 2014/0092683 A1* | 4/2014 | Hyun .................... G11C 16/32 365/185.05 |
| 2016/0239235 A1 | 8/2016 | Chung et al. |
| 2016/0306592 A1 | 10/2016 | Oh et al. |
| 2019/0265888 A1* | 8/2019 | Yang .................... G11C 11/5671 |
| 2020/0081656 A1* | 3/2020 | Park .................... G06F 3/0673 |
| 2020/0211656 A1 | 7/2020 | Oh et al. |

OTHER PUBLICATIONS

European Office Action dated Feb. 9, 2022 corresponding to EP Patent Application No. 21 193 140.7.

Zambelli, C. et al. "Cross-Temperature Effects of Program and Read Operations in 2D and 3D NAND Flash Memories", 2018 International Integrated Reliability Workshop (IIRW), IEEE, Oct. 7, 2018, p. 1-4. DOI : 10.1109/1 IRW .2018.87271.

Sungjin, L. et al. "Using dynamic voltage scaling for energyefficient flash-based storage devices", Soc Design Conference (ISOCC), 2010 International, IEEE, Piscataway, NJ, USA, Nov. 22, 2010, pp. 63-66.

\* cited by examiner

STORAGE DEVICE AND OPERATING METHOD THEREOF

CROSS-REFERENCE TO RELATED APPLICATION

This application claims priority from Korean Patent Application No. 10-2020-0109357 filed on Aug. 28, 2020 and Korean Patent Application No 10-2020-0176470 filed on Dec. 16, 2020 in the Korean Intellectual Property Office, and all the benefits accruing therefrom under 35 U.S.C. 119, the contents of which in its entirety are herein incorporated by reference.

BACKGROUND

1. Technical Field

The present disclosure relates to storage devices and operating methods thereof.

2. Description of the Related Art

A flash memory stores data while changing threshold voltages of memory cells and reads the data using a predetermined read level. Storage devices including a flash memory such as a solid state drive (SSD), a memory card, or the like are widely used. This is because the flash memory is a nonvolatile device having characteristics such as low power consumption, high integration, and the like.

When the flash memory stores write data received from a host, it stores the write data in a memory block of the single-level cell area or a memory block of the multi-level cell area depending on the characteristics of the write data.

SUMMARY

Aspects of the present disclosure provide storage devices with improved performance and operating methods thereof.

Aspects of the present disclosure also provide storage devices that dynamically adjusts a data read speed depending on a state of a memory device, and operating methods thereof.

An example embodiment of the present disclosure provides a storage device includes a memory device including a memory cell array configured to store metadata and main data and a storage controller configured to access the memory device and control the memory device, wherein the storage controller is configured to read data from the memory device at a speed adaptively varying to a first read speed or a second read speed according to a state of the memory device, the second read speed being faster than the first read speed.

An example embodiment of the present disclosure provides a storage device includes a memory device including a single-level cell area and a multi-level cell area; and a storage controller configured to adaptively vary a gear level for reading data stored in the single-level cell area according to a state of the memory device.

An example embodiment of the present disclosure provides an operating method of a storage device includes setting a read speed at a first gear level, reading data from a memory device at the first gear level, changing the setting to a second gear level different from the first gear level according to a state of the memory device and reading data at the second gear level.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Hereinafter, embodiments of the present disclosure will be described with reference to the accompanying drawings.

Figure 1:
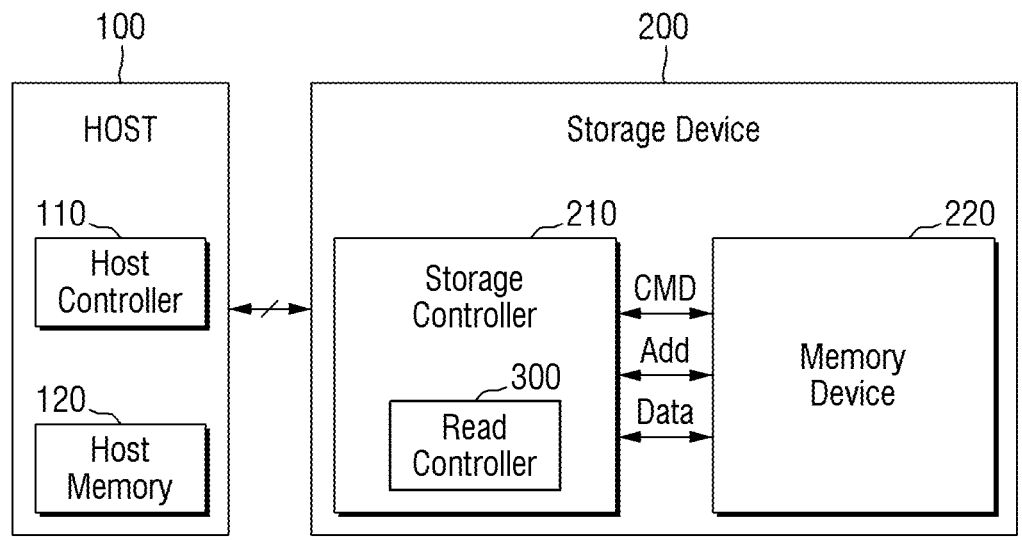
FIG. 1 is a block diagram schematically illustrating a storage system according to some example embodiments.

FIG. 1 is a block diagram schematically illustrating a storage system according to some example embodiments.

Referring to FIG. 1, a host-storage system 10 may include a host 100 and a storage device 200. Further, the storage device 200 may include a storage controller 210 and a memory device (NVM) 220. Further, in some example embodiments of the present disclosure, the host 100 may include a host controller 110 and a host memory 120. The host memory 120 may function as a buffer memory for temporarily storing data to be transmitted to the storage device 200 or data transmitted from the storage device 200.

The storage device 200 may include storage media for storing data in response to a request from the host 100. As one example, the storage device 200 may include at least one of a solid state drive (SSD), an embedded memory, or a removable external memory. When the storage device 200 is the SSD, the storage device 200 may be a device conforming to the nonvolatile memory express (NVMe) standard. When the storage device 200 is the embedded memory or the external memory, the storage device 200 may be a device conforming to the universal flash storage (UFS) standard or the embedded multi-media card (eMMC) standard. The host 100 and the storage device 200 may each generate and transmit a packet conforming to an adopted standard protocol.

When a memory device 220 of the storage device 200 includes a flash memory, the flash memory may include a 2D NAND memory array or a 3D (or vertical) NAND (VNAND) memory array. As another example, the storage device 200 may include various other types of nonvolatile memories. For example, a magnetic RAM (MRAM), a spin-transfer torque MRAM, a conductive bridging RAM (CBRAM), a ferroelectric RAM (FeRAM), a phase RAM (PRAM), a resistive memory (resistive RAM) and various other types of memories may be applied to the storage device 200.

According to some example embodiments, the host controller 110 and host memory 120 may be implemented as different semiconductor chips. Additionally or alternatively, in some example embodiments, the host controller 110 and the host memory 120 may be integrated in the same semiconductor chip. As one example, the host controller 110 may be any one of a plurality of modules provided in an application processor, and the application processor may be implemented as a system on chip (SoC). In addition, the host memory 120 may be an embedded memory provided in the application processor, or a nonvolatile memory or a memory module disposed outside the application processor.

The host controller 110 may manage an operation of storing data (e.g., write data) of the host memory 120 in the memory device 220 or an operation of storing data (e.g., read data) of the memory device 220 in the host memory 120.

Figure 2:
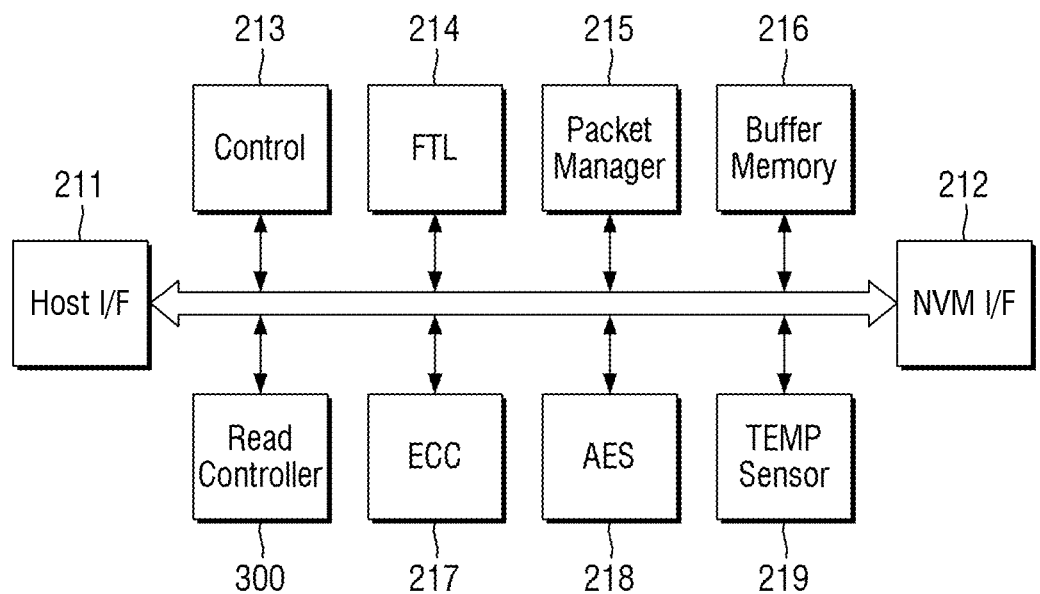
FIG. 2 is a block diagram specifically illustrating a storage controller of FIG. 1.

FIG. 2 is a block diagram specifically illustrating a storage controller of FIG. 1.

The storage controller 210 may include a host interface 211, a NVM interface 212, and a control unit 213. The storage controller 210 may further include a flash translation layer (FTL) 214, a packet manager 215, a buffer memory 216, an error correction code (ECC) engine 217, an advanced encryption standard (AES) engine 218, and a read controller 300. The storage controller 210 may further include a working memory (not shown) in which the flash translation layer (FTL) 214 is loaded, and a data write and read operation for a memory device may be controlled by the control unit 213 executing the flash translation layer.

The host interface 211 may transmit and receive a packet to and from the host 100. The packet transmitted from the host 100 to the host interface 211 may contain a command, data to be written in the memory device 220, and/or the like. The packet transmitted from the host interface 211 to the host 100 may contain a response to the command, data read from the memory device 220, or the like.

The NVM interface 212 may transmit the data to be written in the memory device 220 to the memory device 220, or may receive the data read from the memory device 220. The NVM interface 212 may be implemented to conform to standard conventions such as Toggle or ONFI.

The flash translation layer 214 may perform various functions such as address mapping, wear-leveling, and/or garbage collection. The address mapping is an operation of converting a logical address received from the host to a physical address used for actually storing data in the memory device 220. The wear-leveling is a technique for preventing and/or reducing excessive deterioration of a specific block by equally using blocks in the memory device 220. For example, the wear-leveling may be implemented by a firmware technique for balancing erase counts of physical blocks. The garbage collection is a technique for ensuring an available capacity in the memory device 220 by copying valid data of a block to a new block and then erasing the existing block.

The packet manager 215 may generate a packet corresponding to the protocol of the interface agreed with the host 100, or may parse various information from the packet received from the host 100. Further, the buffer memory 216 may temporarily store data to be written in the memory device 220 or data read from the memory device 220. The buffer memory 216 may be provided in the storage controller 210, or may be provided outside the storage controller 210.

The ECC engine 217 may perform an error detection and correction function for the read data read from the memory device 220. More specifically, the ECC engine 217 may generate parity bits for the write data to be written in the memory device 220, and the parity bits thus generated may be stored in the memory device 220 together with the written data. In the case of reading data from the memory device 220, the ECC engine 217 may correct an error of the read data using the parity bits read from the memory device 220 together with the read data, and output the read data of which the error has been corrected. The ECC engine 217 may transmit an error detection signal for the read data to the read controller 300 in some example embodiments. The error detection signal may be a signal indicating whether or not an error has occurred in some example embodiments, and may be a signal indicating a degree of error occurrence (e.g., the number of error bits) in some example embodiments.

The AES engine 218 may perform at least one of an encryption operation or a decryption operation for data inputted to the storage controller 210 using a symmetric-key algorithm.

In the case of reading data from the memory device 220, the read controller 300 may adaptively set a gear level that is a read speed depending on the characteristics and the operation state of the memory device 220. The gear level may include at least two gear levels. In some example embodiments, the gear level may include a normal read speed (normal gear level) (e.g., a first read speed) and a fast read speed (fast gear level) (e.g., a second read speed) faster than the normal read speed. The fast read speed may be a single gear level in some example embodiments, or may be a plurality of gear levels faster than the normal read speed in some example embodiments. At this time, the normal read speed may be a read speed that is conservatively preset (or, alternatively, set as desired) in consideration of the reliability and the stability of the memory device 220. For example, the normal read speed may be the gear level close to the minimum speed between the maximum speed and the minimum speed of the read speed at which the memory device 220 may operate.

In some example embodiments, the read controller 300 may adaptively switch the gear level depending on the state of the memory device 220. For example, when power is supplied to the storage device 200 (Power On), the read controller 300 may set the gear level to the normal read speed (Level N) during the initial setting period of the memory device 220. For example, when the processing of metadata required for driving the storage device 200 is completed and an open operation is completed (Open Done), the read controller 300 may switch the setting from the normal read speed (Level N) to the fast read speed (Level F) to process general user data or main data at a high speed.

In some example embodiments, the read controller 300 may switch the setting of the gear level from the fast read speed (Level F) to the normal read speed (Level N) if an error exceeds an error threshold Th (error>Th), and may maintain the current setting if the error does not exceed the error threshold Th (error<Th). The error threshold may indicate, e.g., the number of error bits.

The error threshold Th may be a set, or desired, amount in some example embodiments. In some example embodiments, if the error threshold is set to 0 (zero), e.g., if even a single error occurs in the data (Error Occurred), the read controller 300 may switch the setting of the gear level from the fast read speed (Level F) to the normal read speed (Level N). In some example embodiments, even if an error occurs in the data, the read controller 300 may switch the setting of the gear level from the fast speed read speed (Level F) to the normal read speed (Level N) depending on the degree of error occurrence. For example, if the error threshold is set to 2, the current setting, e.g., the fast read speed (Level F) is maintained when a number of the errors in the data is about 1 bit, and the setting may be switched from the fast read speed (Level F) to the normal read speed (Level N) when a number of the errors in the data is 3 bits.

In some example embodiments, when the error of the data is close to the error threshold, e.g., when the error threshold is set to 2 and a number of the errors is 2 bits, the read controller 300 may recheck the degree of error occurrence by reading the data again and then maintain the current setting or switch the gear level based on the recheck result.

In some example embodiments, the read controller 300 may check whether or not an error occurred in the read data and the degree of error occurrence based on the error detection signal of the ECC engine 217. Then, the memory device 220 may switch the gear level to the normal read speed (Level N) and execute the read operation.

For example, the memory device 220 may enter an idle state. At this time, the idle state (Idle) may indicate a state in which there is no request from the host 100 even if a preset (or, alternatively, desired) idle check time TI1 has elapsed from a final completion timing at which the input/output operation between the host 100 and the storage device 200 is completed.

On the other hand, the storage controller 210 may perform a background operation for the memory device 220. Depending on some example embodiments, the background operation may be performed in the middle of the operation of the memory device 220 or may be performed during the idle state of the memory device 220. The memory device 220 may enter a low power mode (hereinafter, referred to as "LP mode") in which there is no operation when a preset (or, alternatively, desired) low power mode enter check time TI2 elapses from a later timing between the timing at which the memory device 220 enters the idle state and the timing at which the background operation is completed. The memory device 220 may be set to the normal read speed in the LP Mode.

Then, when the request from the host 100 is received, the LP mode of the memory device 220 may be ended (LP Mode Exit) and the memory device 220 may be switched to an active mode (Active), so that the gear level may be reset. For example, when the memory device 220 that has maintained the normal read speed (Level N) in the LP mode is switched to the active state, the read controller 300 may switch the setting to the fast read speed (Level F) and operate the memory device 220.

Figure 3:
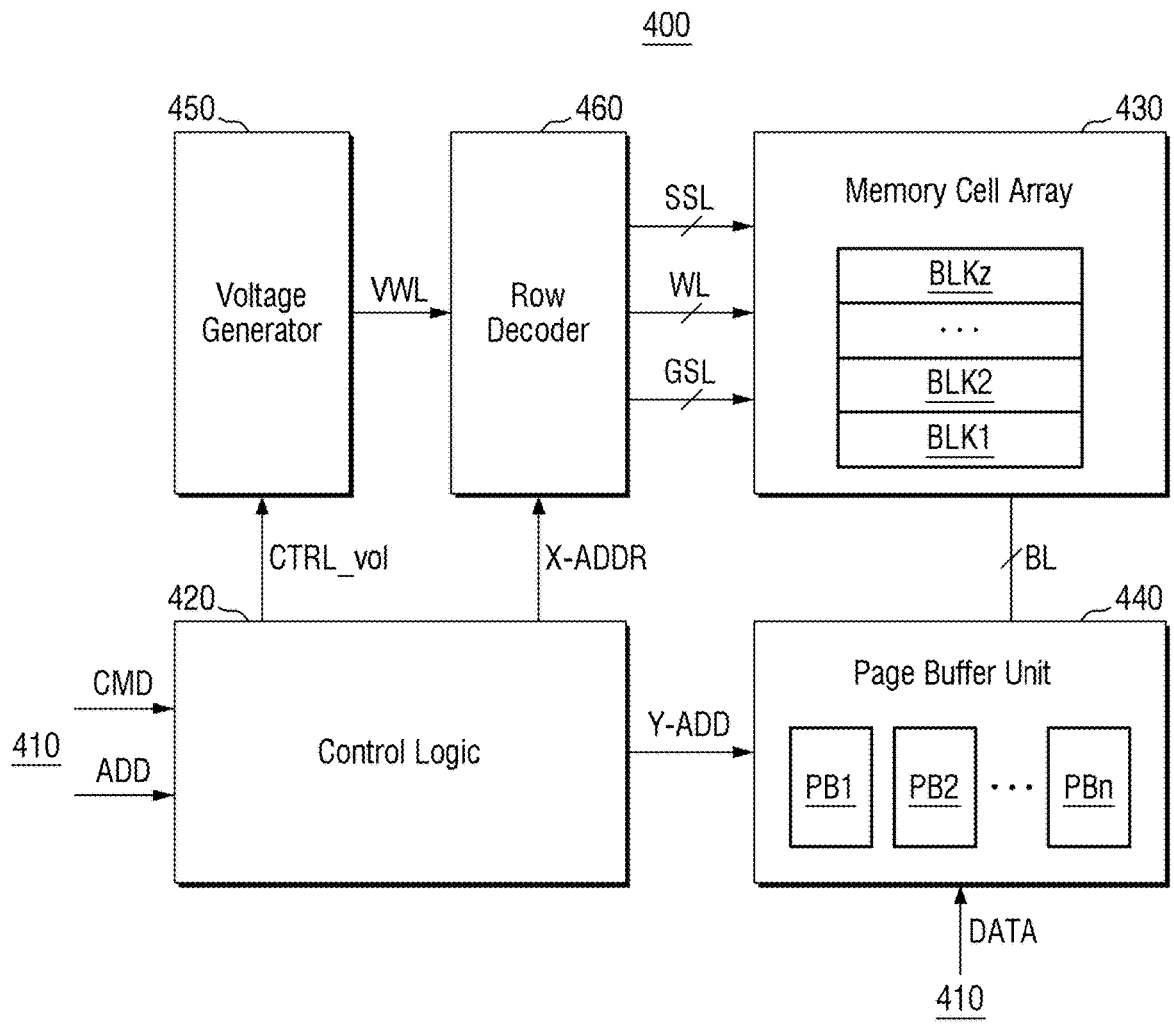
FIG. 3 is a block diagram exemplarily showing a memory device of FIG. 1.
Figure 4:
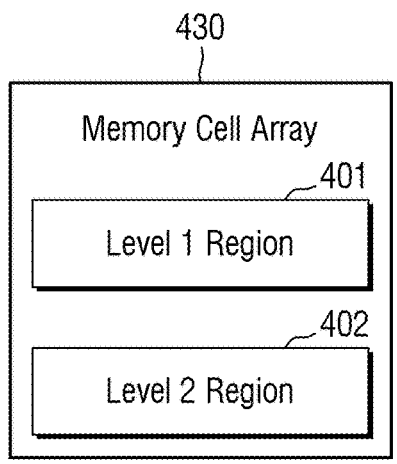
FIG. 4 is block diagrams specifically illustrating a memory cell array of FIG. 3.

FIG. 3 is a block diagram exemplarily showing a memory device of FIG. 1. FIG. 4 is a block diagram specifically illustrating a memory cell array of FIG. 3.

In some example embodiments, the memory device 220 of FIG. 1 may be implemented as a memory device 400 of FIG. 3. The memory device 400 may include a control logic circuit 420, a memory cell array 430, a page buffer unit 440, a voltage generator 450, and a row decoder 460. The memory device 400 may further include a memory interface circuit 410 that transmits and receives a command CMD, an address ADDR, and data DATA to and from the storage controller 210, and may further include a column logic, a pre-decoder, a temperature sensor, a command decoder, an address decoder, or the like.

The control logic circuit 420 may generally control various operations within the memory device 400. The control logic circuit 420 may output various control signals in response to a command CMD and/or an address ADDR from the memory interface circuit 410. For example, the control logic circuit 420 may output a voltage control signal CTRL_vol, a row address X-ADDR, and a column address Y-ADDR.

The memory cell array 430 may include a plurality of memory blocks BLK1 to BLKz (where z is a positive integer), and each of the plurality of memory blocks BLK1 to BLKz may include a plurality of memory cells. The memory cell array 430 may be connected to the page buffer unit 440 through bit lines BL, and may be connected to the row decoder 460 through word lines WL, string select lines SSL, and ground select lines GSL.

In some example embodiments, the memory cell array 430 may include a 3D memory cell array, and the 3D memory cell array may include a plurality of NAND strings. Each NAND string may include memory cells respectively connected to word lines vertically stacked on a substrate. U.S. Pat. Nos. 7,679,133, 8,553,466, 8,654,587, 8,559,235, and U.S. Patent Application Publication No. 2011/0233648 are incorporated herein by reference. In some example embodiments, the memory cell array 430 may include a 2D memory cell array, and the 2D memory cell array may include a plurality of NAND strings arranged along row and column directions.

The page buffer unit 440 may include a plurality of page buffers PB1 to PBn (where n is an integer equal to or greater than 3), and the plurality of page buffers PB1 to PBn may be connected respectively to the memory cells through the plurality of bit lines BL. The page buffer unit 440 may select at least one of the bit lines BL in response to the column address Y-ADDR. The page buffer unit 440 may operate as a write driver or a sense amplifier depending on an operation mode. For example, during a program operation, the page buffer unit 440 may apply, to the selected bit line, a bit line voltage corresponding to data to be programmed. During a read operation, the page buffer unit 440 may sense data stored in the memory cell by sensing a current or voltage of the selected bit line.

The voltage generator 450 may generate various types of voltages for performing program, read, and erase operations based on the voltage control signal CTRL_vol. For example, the voltage generator 450 may generate a program voltage, a read voltage, a program verification voltage, an erase voltage, and the like as a word line voltage VWL.

The row decoder 460 may select one of the plurality of word lines WL and one of the plurality of string select lines SSL, in response to the row address X-ADDR. For example, during a program operation, the row decoder 460 may apply a program voltage and a program verification voltage to the selected word line, and during a read operation, the row decoder 360 may apply a read voltage to the selected word line.

In some example embodiments, when the storage controller 210 transmits a read command, an address, and a read enable signal to the memory device 400, the memory device 400 may read main data corresponding to the address received from the memory cell array 430 in response to the read enable signal. At this time, the speed at which the main data is read is based on the gear level set by the read controller 300. The read controller 300 may adaptively switch the gear level based on the state of the memory device 400.

In some example embodiments, the read controller 300 may determine the state of the memory device 400 based on the transmission/reception state (e.g., ready/busy signal) of the NVM interface 212 and the memory interface 410. Additionally or alternatively, in some example embodiments, the read controller 300 may determine the state of the memory device 400 based on the state information of the memory device 400 received from the control logic circuit 420.

Referring to FIG. 4, the memory cell array 430 may include a plurality of areas (e.g., a level 1 region 401 and a level 2 region 402) divided based on a cell level. Each of the areas may contain a plurality of memory blocks, and may be managed in a different mode. According to some example embodiments, a first area may be managed in a single-level cell (SLC) mode (e.g., the level 1 region 401), and a second area may be managed in a multi-level cell (MLC) mode (e.g., the level 2 region 402). Additionally or alternatively, the second area may be managed in a triple-level cell (TLC) mode or in a quad-level cell (QLC) mode.

For example, the single-level cell (SLC), the multi-level cell (MLC), and the triple-level cell (TLC) may be classified based on the amount of data that may be stored in one memory cell. The single-level cell (SLC) may contain only 1 bit per one cell, the multi-level cell (MLC) may contain 2 bits per one cell, and the triple-level cell (TLC) may contain 3 bits per one cell. Although not shown, the quad-level cell (QLC) may contain 4 bits per one cell. Although the amount of data that may be stored increases from the single-level cells (SLC) toward the quad-level cell (QLC), a data access speed becomes slower and a lifespan becomes shorter.

For example, the speed at which a write operation and a read operation are performed is faster in the first area than in the second area. Data that is changed frequently depending on the pattern of the host 100 may be stored in the first area, and data that is not changed frequently may be stored in the second area.

Although the lifespan of the memory device 220 varies depending on how the memory device 220 is used, the data may be read at a constant speed, e.g., at a fixed single gear level, from a first region 401 or a second region 402 in order to realize or improve data reliability. The fixed gear level may be set to the normal read speed corresponding to the stable standard that satisfies the reliability and the life condition of the memory device while considering the worst condition in terms of the reliability of the memory device.

However, a user hardly experiences a case where data read fails and it is not possible to correct an error while using the memory device 220. Even if the user experiences such a case, it likely occurs just before the life cycle of the memory device 200 is ended. Therefore, when the storage controller 210 reads the data while dynamically changing the gear level depending on the state of the memory device 220 by relaxing a data reliability condition, the data is read at a faster speed while ensuring the reliability of the memory device 220, which makes it possible to improve the performance of the storage device 200.

In some example embodiments, in the case of reading the data of the first region 401, the storage controller 210 operates while changing the gear level to the normal read mode or to the fast read mode depending on the state of the memory device 400, so that the storage device 200 may operate at a high speed while ensuring the data reliability. As described above, the data stored in the first region 401 may be changed more frequently than the data stored in the second region 402, so then it is possible to improve the performance of the storage device 200 by varying the read speed (e.g., the gear level) for the first region 401.

Alternatively, in some example embodiments, in the case of reading the data of the second region 402, the storage controller 210 may operate while changing the gear level to the normal read mode or to the fast read mode depending on the state of the memory device 400.

A more detailed description of the operation will be given below.

Figure 5:
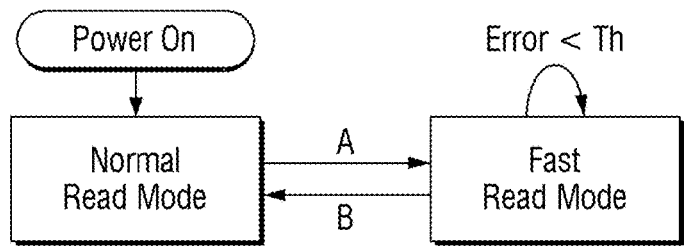
FIG. 5 is a conceptual diagram illustrating the read operation state of a memory device according to some example embodiments.
Figure 6:
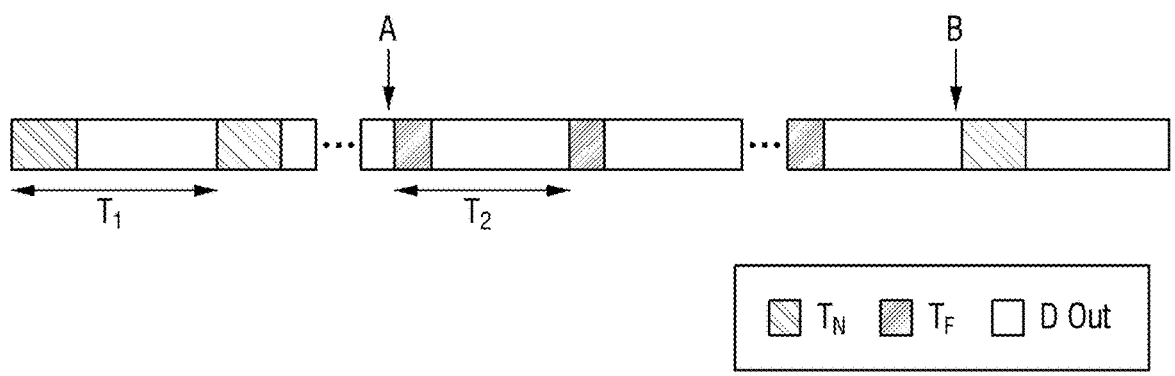
FIG. 6 is a timing diagram illustrating the read operation of a memory device according to some example embodiments.

FIG. 5 is a conceptual diagram illustrating the read operation state of a memory device according to some example embodiments, and FIG. 6 is a timing diagram illustrating the read operation of a memory device according to some example embodiments.

Referring to FIGS. 5 and 6, the storage device 200 according to some example embodiments operates in the fast read mode after the data is written in the memory cell array 430 and before an error occurs. When an error occurs, the storage device 200 operates in the normal read mode depending on the degree of error occurrence, which makes it possible to provide a faster performance in the operation period in which no (or, alternatively, few) errors occur while ensuring the data reliability.

In some example embodiments, the storage device 200 may set an error threshold, compares the number of errors that has occurred in the data with the error threshold, and change the gear level. In one example, if the number of errors exceeds the error threshold Th (number of errors>Th), the gear level may be changed from the fast read speed (Level F) to the normal read speed (Level N). If the number of errors does not exceed the error threshold Th (number of errors<Th), the current settings may be maintained.

The error threshold Th may be set in some example embodiments. In some example embodiments, if the error threshold is set to 0, e.g., if even a single error occurs in the data, the read controller 300 may switch the setting of the gear level from the fast read speed (Level F) to the normal read speed (Level N).

However, it is also possible to set the error threshold to a value greater than or equal to 0 to prevent or reduce frequent gear level switching. In some example embodiments, when the error threshold is set to 2, for example, the storage device may maintain the current setting, e.g., the fast read speed (Level F) if the error of the data is 1 bit, and may switch the setting of the gear level from the fast read speed (Level F) to the normal read speed (Level N) if the error of the data is 3 bits.

As described above, depending on user's intention, the error threshold may be set, or adjusted, to a value at which the degree of error occurrence is tight (e.g., a value at which an error occurrence rate is close to 0) so that the gear level is changed immediately, or may be set, or, adjusted to a value at which the degree of error occurrence is relatively loose (a value at which the error occurrence rate is close to the boundary between an uncorrectable error and a correctable error) so that the gear level is not changed frequently.

In some example embodiments, the read operation state of the memory device 220 may include the normal read mode and the fast read mode.

The normal read mode may be a state corresponding to the stable standard that satisfies the reliability and the life condition of the memory device. For example, the normal read mode may be a state that has assumed the worst condition in terms of the reliability of the memory device. When the memory device 220 is in the normal read mode, the storage controller 210 may set the gear level to the normal read speed (normal read level (Level N)) and read data from the memory cell array 430.

The fast read mode may include a state in which the data reliability condition is relaxed, e.g., an initial state in the life cycle of the memory device or a state close to the initial state in which no error occurs. When the memory device 220 is in the fast read mode, the storage controller 210 may set the gear level to the fast read speed (fast read level (Level F)) and read data from the memory cell array 430.

The fast read mode may operate at a single fast gear level or at a plurality of fast gear levels depending on some example embodiments. In the following description, the case of operating at a single fast gear level will be described as an example, but the scope of the present disclosure is not limited thereto. The storage controller 210, e.g., the read controller 300, may adaptively switch the gear level depending on to the state of the memory device 400. In some example embodiments, the storage device may operate in the normal read mode and be switched to the fast read mode (A), or may operate in the fast read mode and be switched to the normal read mode (B). Specific mode change conditions will be described in detail in FIG. 7.

The gear levels determined by the mode switching may have different periods of time required for the data to be transferred from the memory cell array 430 to the page buffer circuit 440.

Specifically, referring to FIG. 6, it is assumed that $T_1$ and $T_2$ indicate a period of time from when the memory device 220 receives a read command until the memory device 220 outputs data. $T_1$ and $T_2$ are the sum of read times $T_N$ and $T_F$ and a data output time DOut, respectively. It is assumed that $T_1$ is required, or used, in the normal read mode and $T_2$ is required, or used, in the fast read mode.

The time required for the data read from the memory cell array 430 to reach the page buffer 440 after the read command Read CMD and the address ADDR are received from the memory interface 410 is set to the read time. The read time $T_N$ is required in the normal read mode and the read time $T_F$ is required in the fast read mode. In some example embodiments, the read time $T_N$ in the normal read mode is longer than the read time $T_F$ in the fast read mode. In other words, the read time $T_F$ in the fast read mode is shorter than the read time $T_N$ in the normal read mode.

The data output time DOut is required for outputting the data from the memory cell array 430 to the page buffer 440. Since the same size of data is outputted in both the normal read mode and the fast read mode, the data output time Dout may be the same in both modes.

In other words, on the assumption that the same data is read in the normal read mode or the fast read mode, the read operation time is the sum of the read time and the data output time and the data output time is the same, so that the operating speed of the memory device 400 may be different depending on the read time.

The read times $T_N$ and $T_F$ may vary depending on the state of the memory device 400. For example, the first condition (A) in which the normal read time is switched to the fast read time may include the end of the LP mode (LP Mode Exit) and the completion (Open Done) of the power open operation (or initial setting operation) of the memory device 400.

For example, the second condition (B) in which the fast read time is switched to the normal read time may include a case where an error is detected in the data read from the memory cell array 430 (Read Fail).

Additionally or alternatively, in some example embodiments, each of the first condition (A) and the second condition (B) may further include a forced switching condition under the control of the host 100.

Figure 7:
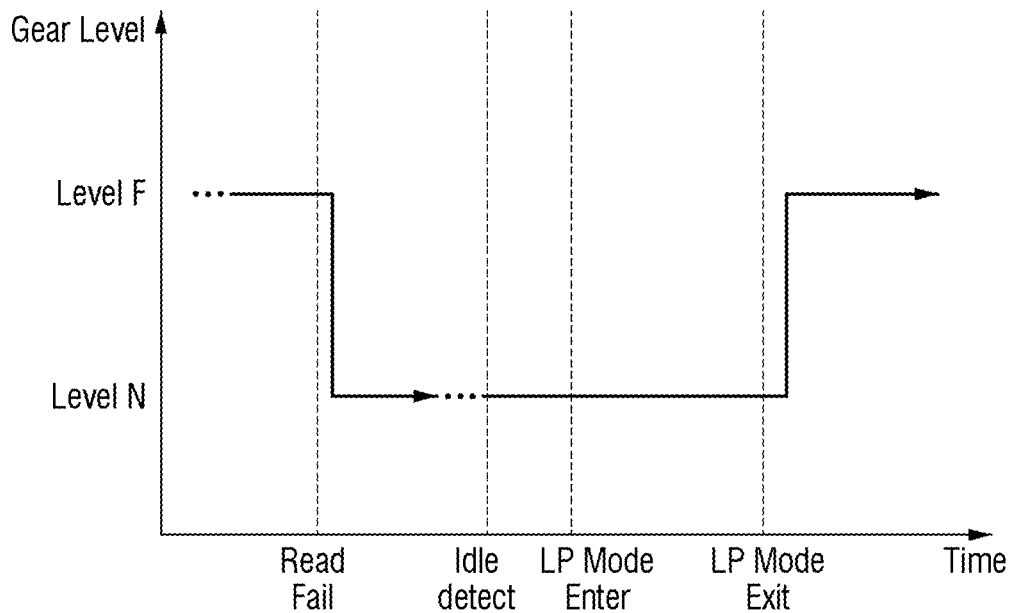
FIG. 7 is a graph illustrating an operating method of a memory device according to some example embodiments.
Figure 8:
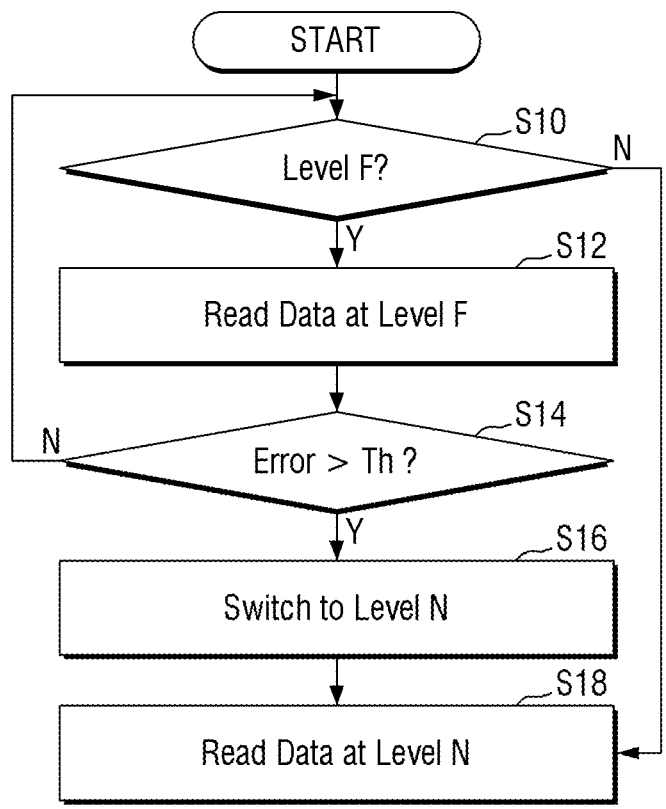
FIG. 8 is a flowchart illustrating the operating method of a memory device of FIG. 7.

FIG. 7 is a graph illustrating an operating method of a memory device according to some example embodiments. FIG. 8 is a flowchart illustrating the operating method of a memory device of FIG. 7.

Referring to FIGS. 7 and 8, in some example embodiments, the read controller 300 sets the gear level to the fast read speed (Level F) (step S10) and drives the memory device 400 (step S12). Then, if an error occurs in the read data (step S14), the gear level may be switched. For example, the read controller 300 may switch the gear level from the fast read speed (Level F) to the normal read speed (Level N) (step S16).

In other words, the memory device 400 may read the data at the switched normal read speed (Level N) to reduce an error rate and increase the reliability of the data.

On the other hand, it is possible to more flexibly determine whether or not to switch the read speed depending on the error threshold value in the step S14. For example, the error threshold Th may be set to a tight value (e.g., a value at which the error occurrence rate is close to 0) so that the gear level may be changed immediately, or may be set to a relatively loose value (a value at which the error occurrence rate is close to the boundary between an uncorrectable error and a correctable error) so that the gear level may not be changed frequently.

The read controller 300 may determine whether or not an error has been detected in the read data based on the error detection signal of the ECC engine 217 in some example embodiments or based on the control signal of the control unit 213 in some example embodiments, and then determine whether or not to switch the gear level based on the determination result.

The control unit 213 may constantly monitor the operation state of the memory device 400. In one example, the state of the memory device may be checked based on the transmission/reception of signals between the NVM interface 212 and the memory interface 410. In another example, the state of the memory device may be checked based on the state information received from the memory device 400.

For example, when the preset (or, alternatively, desired) idle check time TI1 elapses from the stop of the input/output operation between the host 100 and the storage device 200, the control unit 213 may determine that the storage device 200 is in the idle state (Idle Detect). If the control unit 213 determines that the storage device 200 is in the idle state, the read controller 300 may set the memory device 400 to continuously operate in the normal read mode (Level N) (steps S10 and S18).

The control unit 213 may enter the LP mode from the idle mode in response to the request from the host 100 or when a preset (or, alternatively, desired) LP mode enter check time T12 elapses from a later timing between a timing at which the storage device 200 enters the idle state and a timing at which the background operation is completed. At this time, the background operation for the memory device 400 may be performed between the idle mode and the LP mode. The background operation may include, e.g., migration of the data of the memory cell array 403 from the single-level cell area to the multi-level cell area, the garbage collection, and/or other system operations related to the driving of the memory device 400.

The control unit 213 that has maintained the LP mode may end the LP mode and switch the memory device 400 to an active move (Active) when the request (e.g., data access) from the host 100 is received. Unless there are special circumstances such as the request from the host and the like, the read controller 300 may switch the gear level from the normal read speed (Level N) to the fast read speed (Level F) and drive the memory device 400.

Figure 9:
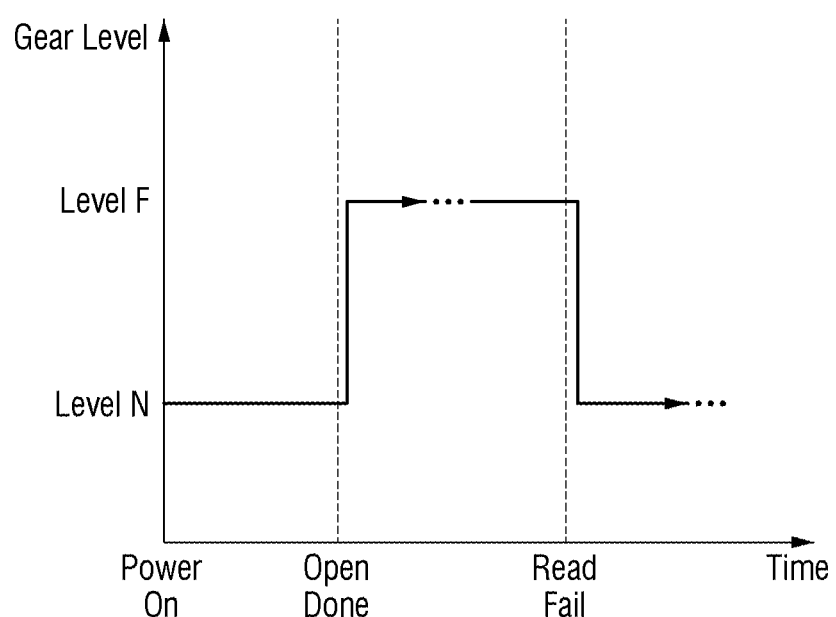
FIG. 9 is a graph illustrating an operating method of a memory device according to some example embodiments.
Figure 10:
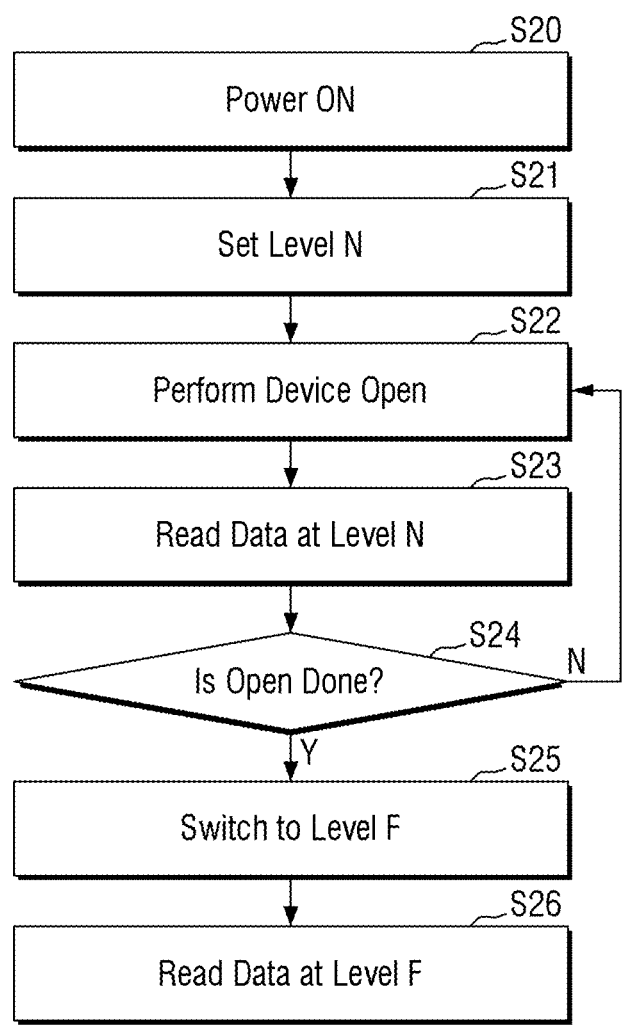
FIG. 10 is a flowchart illustrating the operating method of a memory device of FIG. 9.

FIG. 9 is a graph illustrating an operating method of a memory device according to some example embodiments. FIG. 10 is a flowchart illustrating the operating method of a memory device of FIG. 9.

Referring to FIGS. 9 and 10, first, when power is supplied to the storage device 200 (Power On, step S20), an open operation (Device Open) for the memory device 400 is performed (step S22). The open operation, which is an initial setting operation for driving the memory device 400, may include an operation of initializing context of the memory device 400 and checking the integrity of the metadata recorded in a part of the memory cell array 430. The metadata may be driving-related data, e.g., mapping information of the file translation layer, and/or the like. Since the integrity of the metadata, e.g., the reliability of the data, is important, the read controller 300 may set the gear level to the normal read speed (Level N) (step S21), and the memory device may perform the open operation (step S22) and read data at the normal read speed (Level N) (step S23)

When the open operation is completed (Open Done, step S24), the memory device 400 is ready to operate in response to the request from the host 100, so that the read controller 300 may switch the gear level to the faster level. In other words, the gear level may be switched from the normal read speed (Level N) to the fast reed speed (Level F) (step S25). The memory device 400 may read data more quickly by reading the normal data at the fast read speed in a next read operation (step S26).

However, if a data error is detected (Error Occurred) while the memory device 400 is reading the data at the fast read speed (Level F), the fast read speed may be maintained or may be switched to the normal read sped (Level N) depending on the result of comparison between the data error and the error threshold.

Specifically, the error threshold may be compared as a trigger for the gear level switching with the error that has occurred in the data. If the error exceeds the error threshold Th (error>Th), the gear level may be switched from the fast speed read speed (Level F) to the normal read speed (Level N) (B). If the error does not exceed the error threshold Th (error<Th), the current setting may be maintained.

The error threshold Th may be set in some example embodiments. In some example embodiments, if the error threshold is set to 0, e.g., if even a single error occurs in the data (Error Occurred), the read controller 300 may switch the setting of the gear level from the fast read speed (Level) to the normal read speed (Level N).

However, it is also possible to set the error threshold to a value greater than or equal to 0 to prevent or reduce frequent gear level switching. In some example embodiments, if the error threshold is set to 2, the storage device may maintain the current setting, e.g., the fast read speed (Level F) when the error of the data is about 1 bit and may switch the setting from the fast read speed (Level F) to the normal read speed (Level N) when the error of the data is 3 bits.

By adaptively switching the gear level depending on the state of the memory, e.g., depending on whether or not an error has occurred or the degree of error occurrence, it is possible to improve the operating speed of the storage device while maintaining the data reliability.

Figure 11:
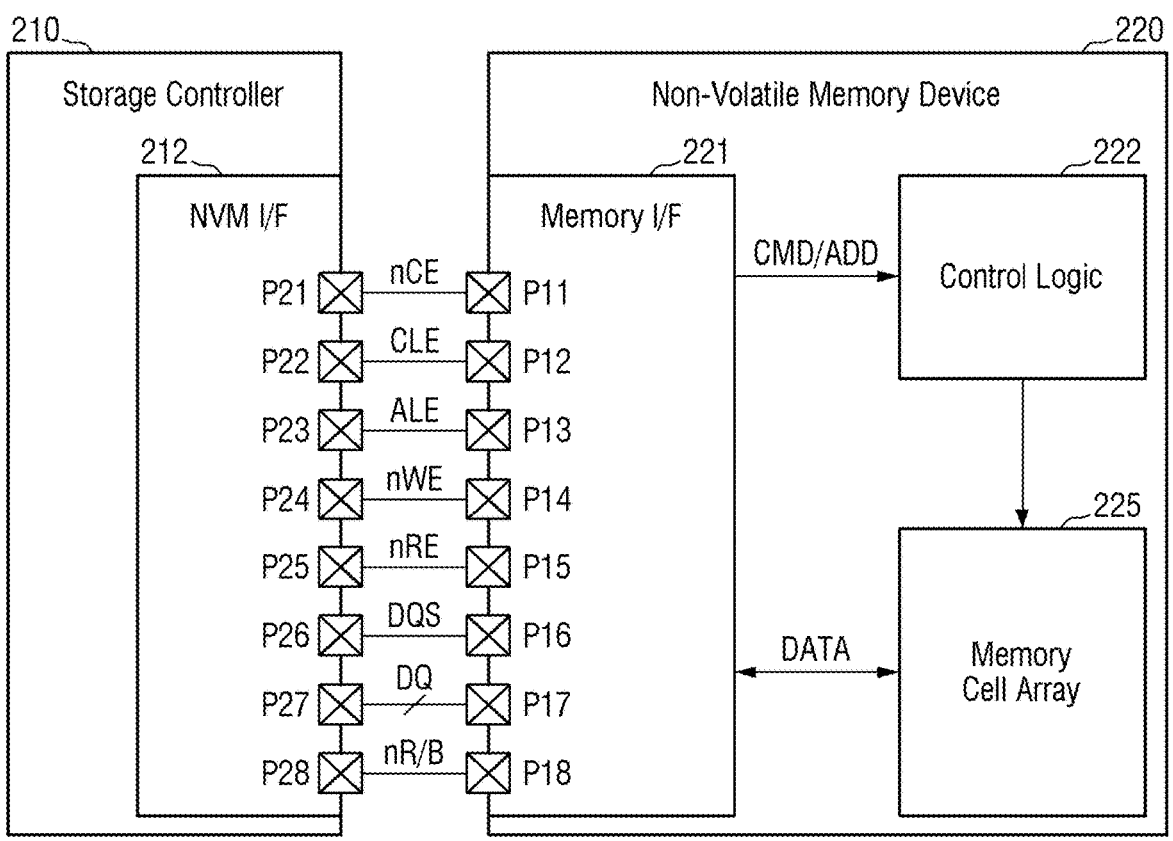
FIG. 11 is a block diagram illustrating a memory system according to some example embodiments of the present disclosure.

FIG. 11 is a block diagram illustrating a memory system according to some example embodiments of the present disclosure. Referring to FIG. 11, the storage device 200 may include a memory device 220 and a storage controller 210. The storage device may include a plurality of memory devices 220 (e.g., nonvolatile memory devices NVM11 to NVMmn) which may communicate with the storage controller through a plurality of channels (e.g., channels Ch1 to CHm), not shown. The memory device 220, in some example embodiments, may correspond to one of the nonvolatile memory devices NVM11 to NVMmn communicating with the storage controller 210 based on one of the plurality of channels CH1 to CHm.

The memory device 220 may include first to eighth pins P11 to P18, a memory interface circuit 221, a control logic circuit 222, and a memory cell array 225. The memory device 220 may be the memory device 400 of FIG. 3, the memory interface 221 may be the memory interface 410 of FIG. 3, the control logic circuit 222 may be the control logic circuit 420 of FIG. 3, and the memory cell array 225 may be the memory cell array 430 of FIG. 3.

The memory interface circuit 221 may receive a chip enable signal nCE from the storage controller 210 through the first pin P11. The memory interface circuit 221 may transmit and receive signals to and from the storage controller 210 through the second to the eighth pins P12 to P18 in response to the chip enable signal nCE. For example, when the chip enable signal nCE is in an enabled state (e.g., low level), the memory interface circuit 221 may transmit and receive signals to and from the storage controller 210 through the second to eighth pins P12 to P18.

The memory interface circuit 221 may receive a command latch enable signal CLE, an address latch enable signal ALE, and a write enable signal nWE from the storage controller 210 through the second to fourth pins P12 to P14. The memory interface circuit 221 may receive a data signal DQ from the storage controller 210 or transmit the data signal DQ to the storage controller 210 through the seventh pin P17. The commands CMD, the address ADDR, and the data DATA may be transferred through the data signal DQ. For example, the data signal DQ may be transferred through a plurality of data signal lines. In this case, the seventh pin P17 may include a plurality of pins corresponding to the plurality of data signals.

The memory interface circuit 221 may acquire the command CMD from the data signal DQ received in the enable period (e.g., high level state) of the command latch enable signal CLE based on toggle timings of the write enable signal nWE. The memory interface circuit 221 may acquire the address ADDR from the data signal DQ received in the enable period (e.g., high level state) of the address latch enable signal ALE based on toggle timings of the write enable signal nWE.

In some example embodiments, the write enable signal nWE may maintain a static state (e.g., high level or low level) and toggle between the high level and the low level. For example, the write enable signal nWE may toggle in the transmission period of the command CMD or the address ADDR. Accordingly, the memory interface circuit 221 may acquire the command CMD or the address ADDR based on the toggle timings of the write enable signal nWE.

The memory interface circuit 221 may receive the read enable signal nRE from the storage controller 210 through the fifth pin P15. The memory interface circuit 221 may receive a data strobe signal DQS from the storage controller 210 or transmit the data strobe signal DQS to the storage controller 210 through the sixth pin P16.

In the data DATA output operation of the memory device 220, the memory interface circuit 221 may receive the toggling read enable signal nRE through the fifth pin P15 before the data DATA is outputted. The memory interface circuit 221 may generate the data strobe signal DQS toggling based on the toggling of the read enable signal nRE. For example, the memory interface circuit 221 may generate the data strobe signal DQS that starts to toggle after a predetermined delay (e.g., tDQSRE) based on the toggling start time of the read enable signal nRE. The memory interface circuit 221 may transmit the data signal DQ including the data DATA based on the toggle timing of the data strobe signal DQS. Accordingly, the data DATA may be transmitted to the storage controller 210 while being aligned with the toggle timing of the data strobe signal DQS.

In the data DATA input operation of the memory device 220, when the data signal DQ including the data DATA is received from the storage controller 210, the memory interface circuit 221 may receive the data strobe signal DQS toggling together with the data DATA from the storage controller 210. The memory interface circuit 221 may acquire the data DATA from the data signal DQ based on the toggle timing of the data strobe signal DQS. For example, the memory interface circuit 221 may acquire the data DATA by sampling the data signal DQ at the rising edge and the falling edge of the data strobe signal DQS.

The memory interface circuit 221 may transmit a ready/busy output signal nR/B to the storage controller 210 through the eighth pin P18. The memory interface circuit 221 may transmit the state information of the memory device 220 to the storage controller 210 through the ready/busy output signal nR/B. When the memory device 220 is in a busy state (e.g., when the internal operations of the memory device 220 are being performed), the memory interface circuit 221 may transmit the ready/busy output signal nR/B indicating the busy state to the storage controller 210. When the memory device 220 is in a ready state (e.g., when the internal operations of the memory device 220 are not being performed or completed), the memory interface circuit 221 may transmit the ready/busy signal nR/B indicating the ready state the storage controller 210. For example, while the memory device 220 is reading the data DATA from the memory cell array 225 in response to a page read command, the memory interface circuit 221 may transmit the ready/busy output signal nR/B indicating the busy state (e.g., low level) to the storage controller 210. For example, while the memory device 220 is programming the data DATA in the memory cell array 225 in response to a program command, the memory interface circuit 221 may transmit the ready/busy output signal nR/B indicating the busy state to the storage controller 210.

The control logic circuit 222 may generally control various operations of the memory device 220. The control logic circuit 222 may receive the command CMD/address ADDR acquired from the memory interface circuit 221. The control logic circuit 222 may generate control signals for controlling other components of the memory device 220 in response to the received command CMD/address ADDR. For example, the control logic circuit 222 may generate various control signals for programming the data DATA in the memory cell array 225 or reading the data DATA from the memory cell array 225.

The memory cell array 225 may store the data DATA acquired from the memory interface circuit 221 under the control of the control logic circuit 222. The memory cell array 225 may output the stored data DATA to the memory interface circuit 221 under the control of the control logic circuit 222.

The memory cell array 225 may include a plurality of memory cells. For example, the plurality of memory cells may be flash memory cells. However, the present disclosure is not limited thereto, and the memory cells may include resistive random access memory (RRAM) cells, ferroelectric random access memory (FRAM) cells, phase change random access memory (PRAM) cells, thyristor random access memory (TRAM) cells, and magnetic random access memory (MRAM) cells, or the like. Hereinafter, embodiments of the present disclosure will be described focusing on some example embodiments in which the memory cells are NAND flash memory cells.

The storage controller 210 may include first to eighth pins P21 P28, and an NVM interface circuit 212. The first to eighth pins P21 to P28 may correspond to the first to eighth pins P11 to P18 of the memory device 220.

The NVM interface circuit 212 in the controller may transmit the chip enable signal nCE to the memory device 220 through the first pin P21. The NVM interface circuit 212 may transmit and receive signals to and from the memory device 220 selected using the chip enable signal nCE through the second to eighth pins P22 to P28.

The NVM interface circuit 212 may transmit the command latch enable signal CLE, the address latch enable signal ALE, and the write enable signal nWE to the memory device 220 through the second to fourth pins P22 to P24. The NVM interface circuit 212 may transmit the data signal DQ to the memory device 220 or receive the data signal DQ from the memory device 220 through the seventh pin P27.

The NVM interface circuit 212 may transmit the data signal DQ including the command CMD or the address ADDR to the memory device 220 together with the toggling write enable signal nWE. The NVM interface circuit 212 may transmit the data signal DQ including the command CMD to the memory device 220 by transmitting the command latch enable signal CLE having an enable state, and may transmit the data signal DQ including the address ADDR to the memory device 220 by transmitting the address latch enable signal ALE having an enable state.

The NVM interface circuit 212 may transmit the read enable signal nRE to the memory device 220 through the fifth pin P25. The NVM interface circuit 212 may receive the data strobe signal DQS from the memory device 220 or transmit the data strobe signal DQS to the memory device 220 through the sixth pin P26.

In the data DATA output operation of the memory device 220, the NVM interface circuit 212 may generate the toggling read enable signal nRE and transmit the read enable signal nRE to the memory device 220. For example, the NVM interface circuit 212 may generate the read enable signal nRE that is switched from the static state (e.g., high level or low level) to the toggle state before the data DATA is outputted. Accordingly, the memory device 220 may generate the toggling data strobe signal DQS based on the read enable signal nRE. The NVM interface circuit 212 may receive the data signal DQ including the data DATA together with the toggling data strobe signal DQS from the memory device 220. The NVM interface circuit 212 may acquire the data DATA from the data signal DQ based on the toggle timing of the data strobe signal DQS.

In some example embodiments, the NVM interface circuit 212 may transmit the read command Read CMD, the address ADDR, and the read enable signal nRE to the memory device 220. In this case, the memory device 400 may read the main data corresponding to the address received from the memory cell array 430 in response to the read enable signal nRE. At this time, the speed at which the main data is read is based on the gear level set by the read controller 300. The read controller 300 may adaptively switch the gear level based on the state of the memory device 400.

In the data DATA input operation of the memory device 220, the NVM interface circuit 212 may generate the toggling data strobe signal DQS. For example, the NVM interface circuit 212 may generate the data strobe signal DQS that is switched from the static state (e.g., high level or low level) to the toggle state before the data DATA is transmitted. The NVM interface circuit 212 may transmit the data signal DQ including the data DATA to the memory device 220 based on the toggle timings of the data strobe signal DQS.

The NVM interface circuit 212 may receive the ready/busy output signal nR/B from the memory device 220 through the eighth pin P28. The NVM interface circuit 212 may determine the state information of the memory device 220 based on the ready/busy output signal nR/B.

Figure 12:
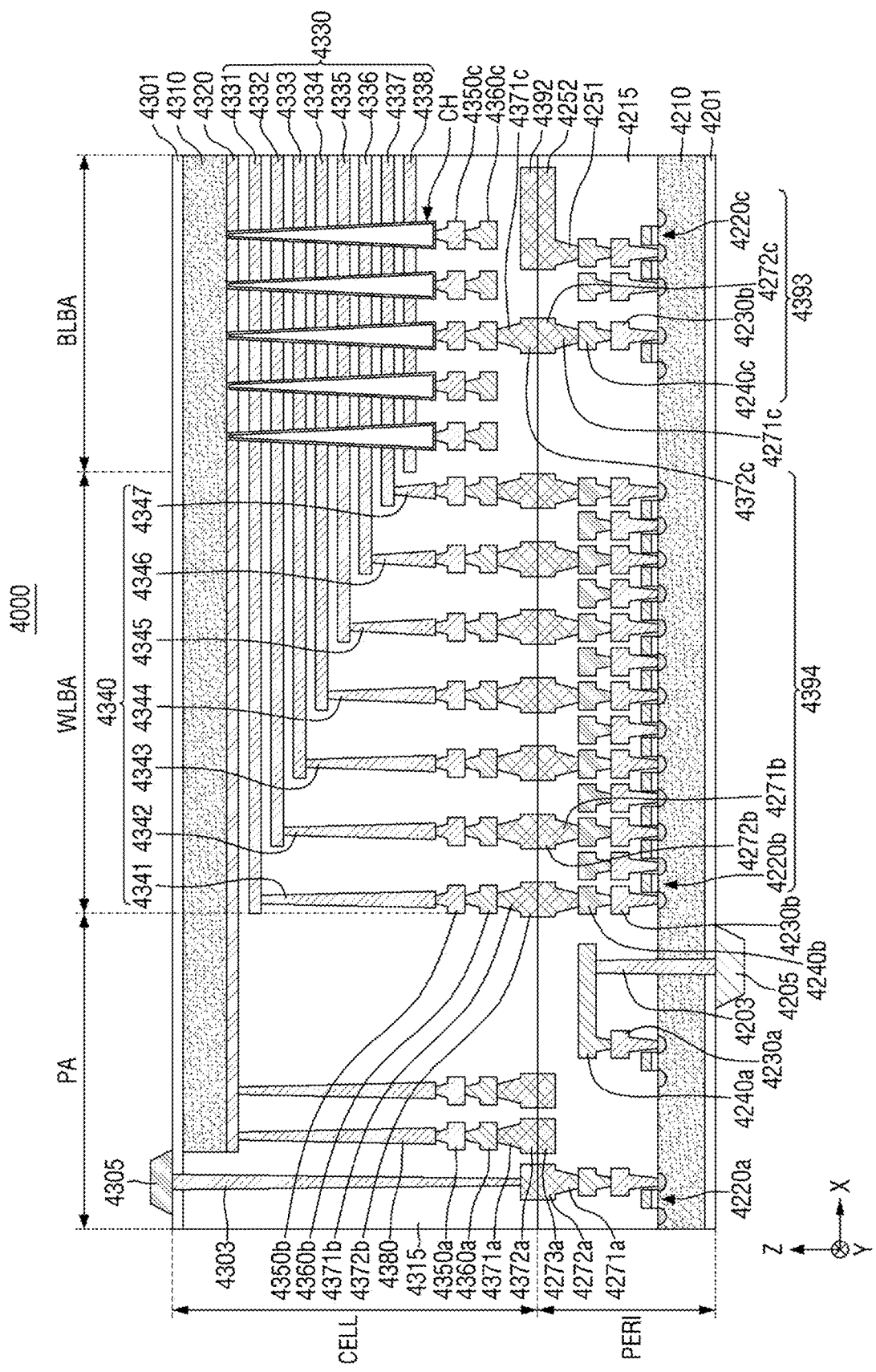
FIG. 12 is a diagram illustrating a 3D V-NAND structure that may be applied to the memory device 220 of FIG. 1.

FIG. 12 is a diagram illustrating a 3D V-NAND structure that may be applied to the memory device 220 of FIG. 1.

Referring to FIG. 12, a memory device 4000 may have a chip to chip (C2C) structure. The C2C structure may mean a structure obtained by manufacturing an upper chip including a cell region CELL on a first wafer, manufacturing a lower chip including a peripheral circuit region PERI on a second wafer different from the first wafer, and connecting the upper chip and the lower chip to each other by a bonding method. In one example, the bonding method may mean a method of electrically connecting a bonding metal formed on an uppermost metal layer of the upper chip to a bonding metal formed on an uppermost metal layer of the lower chip. For example, when the bonding metal is formed of copper (Cu), the bonding method may be a Cu—Cu bonding method, and the bonding metal may also be formed of aluminum or tungsten.

Each of the peripheral circuit region PERI and the cell region CELL of the memory device 4000 may include an external pad bonding area PA, a word line bonding area WLBA, and a bit line bonding area BLBA.

The peripheral circuit region PERI may include a first substrate 4210, an interlayer insulating layer 4215, a plurality of circuit elements 4220a, 4220b, and 4220c formed on the first substrate 4210, a first metal layer 4230a, 4230b, and 4230c connected to each of the plurality of circuit elements 4220a, 4220b, and 4220c, and a second metal layer 4240a, 4240b, and 4240c formed on the first metal layer 4230a, 4230b, and 4230c. In some example embodiments, the first metal layer 4230a, 4230b, and 4230c may be formed of tungsten having a relatively high resistance, and the second metal layer 4240a, 4240b, and 4240c may be formed of copper having a relatively low resistance.

In some example embodiments, only the first metal layer 4230a, 4230b, and 4230c and the second metal layer 4240a, 4240b, and 4240c are illustrated and described, but the present disclosure is not limited thereto, and one or more metal layers may be further formed on the second metal layer 4240a, 4240b, and 4240c. At least some of the one or more metal layers formed on the second metal layer 4240a, 4240b, and 4240c may be formed of aluminum or the like having a lower resistance than copper forming the second metal layer 4240a, 4240b, and 4240c.

The interlayer insulating layer 4215 may be disposed on the first substrate 4210 to cover the plurality of circuit elements 4220a, 4220b, and 4220c, the first metal layer 4230a, 4230b, and 4230c, and the second metal layer 4240a, 4240b, and 4240c, and may include an insulating material such as silicon oxide or silicon nitride.

Lower bonding metals 4271b and 4272b may be formed on the second metal layer 4240b in the word line bonding area WLBA. In the word line bonding area WLBA, the lower bonding metals 4271b and 4272b of the peripheral circuit region PERI may be electrically connected to upper bonding metals 4371b and 4372b of the cell region CELL by a bonding method. The lower bonding metals 4271b and 4272b and the upper bonding metals 4371b and 4372b may be formed of aluminum, copper, tungsten, or the like.

The cell region CELL may provide at least one memory block. The cell region CELL may include a second substrate 4310 and a common source line 4320. A plurality of word lines 4331 to 4338 (4330) may be stacked on the second substrate 4310 along a direction (Z-axis direction) perpendicular to the top surface of the second substrate 4310. String select lines and a ground select line may be disposed above and below the word lines 4330, respectively, and the plurality of word lines 4330 may be disposed between the string select lines and the ground select line.

In the bit line bonding area BLBA, a channel structure CH may extend in a direction perpendicular to the top surface of the second substrate 4310 to penetrate the word lines 4330, the string select lines, and the ground select line. The channel structure CH may include a data storage layer, a channel layer, a buried insulating layer, and the like. The channel layer may be electrically connected to a first metal layer 4350c and a second metal layer 4360c. For example, the first metal layer 4350c may be a bit line contact, and the second metal layer 4360c may be a bit line. In some example embodiments, the bit line 4360c may extend along a first direction (Y-axis direction) parallel to the top surface of the second substrate 4310.

In some example embodiments illustrated in FIG. 12, an area in which the channel structure CH and the bit line 4360c are disposed may be defined as the bit line bonding area BLBA. In the bit line bonding area BLBA, the bit line 4360c may be electrically connected to the circuit elements 4220c that provide a page buffer 4393 in the peripheral circuit region PERI. As one example, the bit line 4360c may be connected to an upper bonding metal 4371c and 4372c in the peripheral circuit region PERI, and the upper bonding metal 4371c and 4372c may be connected to a lower bonding metal 4271c and 4272c connected to the circuit elements 4220c of the page buffer 4393.

In the word line bonding area WLBA, the word lines 4330 may extend along a second direction (X-axis direction) parallel to the top surface of the second substrate 4310, and may be connected to a plurality of cell contact plugs 4340 (4341 to 4347). The word lines 4330 and the cell contact plugs 4340 may be connected to each other in pads provided by at least some of the word lines 4330 extending with different lengths along the second direction. A first metal layer 4350b and a second metal layer 4360b may be sequentially connected to the top portions of the cell contact plugs 4340 connected to the word lines 4330. In the word line bonding area WLBA, the cell contact plugs 4340 may be connected to the peripheral circuit region PERI through the upper bonding metals 4371b and 4372b of the cell region CELL and the lower bonding metals 4271*b* and 4272*b* of the peripheral circuit region PERI.

The cell contact plugs 4340 may be electrically connected to the circuit elements 4220*b* that provide a row decoder 4394 in the peripheral circuit region PERI. In some example embodiments, the operating voltage of the circuit elements 4220*b* providing the row decoder 4394 may be different from the operating voltage of the circuit elements 4220*c* providing the page buffer 4393. As one example, the operating voltage of the circuit elements 4220*c* providing the page buffer 4393 may be greater than the operating voltage of the circuit elements 4220*b* providing the row decoder 4394.

A common source line contact plug 4380 may be disposed in the external pad bonding area PA. The common source line contact plug 4380 may be formed of a conductive material such as a metal, a metal compound, or polysilicon, and may be electrically connected to the common source line 4320. A first metal layer 4350*a* and a second metal layer 4360*a* may be sequentially stacked on the common source line contact plug 4380. As one example, an area in which the common source line contact plug 4380, the first metal layer 4350*a*, and the second metal layer 4360*a* are disposed may be defined as the external pad bonding area PA.

Meanwhile, input/output pads 4205 and 4305 may be disposed in the external pad bonding area PA. Referring to FIG. 12, below the first substrate 4210, a lower insulating layer 4201 may be formed to cover the bottom surface of the first substrate 4210, and a first input/output pad 4205 may be formed on the lower insulating layer 4201. The first input/output pad 4205 may be connected to at least one of the plurality of circuit elements 4220*a*, 4220*b*, and 4220*c* disposed in the peripheral circuit region PERI through a first input/output contact plug 4203, and may be separated from the first substrate 4210 by the lower insulating layer 4201. In addition, a side insulating layer may be disposed between the first input/output contact plug 4203 and the first substrate 4210 to electrically separate the first input/output contact plug 4203 from the first substrate 4210.

Referring to FIG. 12, an upper insulating layer 4301 may be formed on the second substrate 4310 to cover the top surface of the second substrate 4310, and a second input/output pad 4305 may be disposed on the upper insulating layer 4301. The second input/output pad 4305 may be connected to at least one of the plurality of circuit elements 4220*a*, 4220*b*, and 4220*c* disposed in the peripheral circuit region PERI through a second input/output contact plug 4303.

According to some example embodiments, the second substrate 4310, the common source line 4320, and the like may not be disposed in an area where the second input/output contact plug 4303 is disposed. In addition, the second input/output pad 4305 may not overlap the word lines 4330 in the third direction (Z-axis direction). Referring to FIG. 12, the second input/output contact plug 4303 may be separated from the second substrate 4310 in a direction parallel to the top surface of the second substrate 4310, and may penetrate an interlayer insulating layer 4315 of the cell region CELL to be connected to the second input/output pad 4305.

According to some example embodiments, the first input/output pad 4205 and the second input/output pad 4305 may be selectively formed. For example, the memory device 4000 may include only the first input/output pad 4205 disposed below the first substrate 4210, or only the second input/output pad 4305 disposed above the second substrate 4310. Additionally or alternatively, the memory device 4000 may include both the first input/output pad 4205 and the second input/output pad 4305.

In each of the external pad bonding area PA and the bit line bonding area BLBA included in each of the cell region CELL and the peripheral circuit region PERI, an uppermost metal layer may have a metal pattern existing as a dummy pattern, or may be empty.

In the memory device 4000, in the external pad bonding area PA, corresponding to an upper metal pattern 4372*a* formed in the uppermost metal layer of the cell region CELL, a lower metal pattern 4273*a* having the same shape as that of the upper metal pattern 4372*a* of the cell region CELL may be formed in the uppermost metal layer of the peripheral circuit region PERI. The lower metal pattern 4273*a* formed on the uppermost metal layer of the peripheral circuit region PERI may not be connected to a separate contact in the peripheral circuit region PERI. Similarly, in the external pad bonding area PA, corresponding to the lower metal pattern formed in the uppermost metal layer of the peripheral circuit region PERI, the upper metal pattern having the same shape as the lower metal pattern of the peripheral circuit region PERI may be formed in the upper metal layer of the cell region CELL.

Lower bonding metals 4271*b* and 4272*b* may be formed on the second metal layer 4240*b* in the word line bonding area WLBA. In the word line bonding area WLBA, the lower bonding metals 4271*b* and 4272*b* of the peripheral circuit region PERI may be electrically connected to the upper bonding metals 4371*b* and 4372*b* of the cell region CELL by a bonding method.

In addition, in the bit line bonding area BLBA, corresponding to the lower metal pattern 4252 formed in the uppermost metal layer of the peripheral circuit region PERI, the upper metal pattern 4392 having the same shape as the lower metal pattern 4252 of the peripheral circuit region PERI may be formed in the uppermost metal layer of the cell region CELL. A contact may not be formed on the upper metal pattern 4392 formed in the uppermost metal layer of the cell region CELL.

It will be understood that some or all of any of the devices, controllers, generators, decoders, units, modules, circuits, processors, or the like according to any of the example embodiments as described herein, including some or all of storage device 200, storage controller 210, read controller 300, memory device 220, host 100, host controller 110, and host memory 120 shown in FIG. 1, the host interface 211, NVM interface 212, control unit 213, flash translation layer (FTL) 214, packet manager 215, buffer memory 216, error correction code (ECC) engine 217, advanced encryption standard (AES) engine 218, and read controller 300 shown in FIG. 2, the control logic 420, memory cell array 430, page buffer unit 440, voltage generator 450 and row decoder 460 shown in FIG. 3, the memory interface circuit 221, control logic circuit 222, and memory cell array 225 and their respective sub elements shown in FIG. 11, any combination thereof, or the like may be included in, may include, and/or may be implemented by one or more instances of processing circuitry such as hardware including logic circuits, a hardware/software combination such as a processor executing software; or a combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories, memory units, or the like as described herein may include a non-transitory computer readable storage device, for example a solid state drive (SSD), storing a program of instructions, and the one or more instances of processing circuitry may be configured to execute the program of instructions to implement the functionality of some or all of any of the devices, controllers, decoders, units, modules, or the like according to any of the example embodiments as described herein, including any of the methods of operating any of same as described herein.

Although the figures illustrate circuit elements as being distinct, example embodiments are not limited thereto, and some of the functions of circuit elements and units may be performed by other circuit elements and units (e.g., the host interface 211 may have some functions performed by one or more of the NVM interface 212, control unit 213, flash translation layer (FTL) 214, packet manager 215, buffer memory 216, error correction code (ECC) engine 217, advanced encryption standard (AES) engine 218, and read controller 300 shown in FIG. 2; and host 100 of FIG. 1). This may also be the case of additional elements within the peripheral circuit 200 as described in example embodiments herein.

In concluding the detailed description, those skilled in the art will appreciate that many variations and modifications can be made to the example embodiments without substantially departing from the principles of the present disclosure. Therefore, the disclosed example embodiments are used in a generic and descriptive sense only and not for purposes of limitation.

What is claimed is:

1. A storage device comprising:
a memory device including a memory cell array configured to store metadata and main data; and
a storage controller configured to access the memory device and control the memory device,
wherein the storage controller is configured to read data from the memory device at a speed adaptively varying to a first read speed or a second read speed according to a state of the memory device, the second read speed being faster than the first read speed, the state of the memory device being based on an operation state of the memory device and a transmission/reception state of the memory device.

2. The storage device of claim 1, wherein the storage controller is configured to operate the memory device at the second read speed until an error is detected in the read data.

3. The storage device of claim 2, wherein when reading the metadata, the storage controller is configured to operate the memory device at the first read speed.

4. The storage device of claim 2, wherein based on the error exceeding an error threshold, the storage controller is configured to operate the memory device at the first read speed.

5. The storage device of claim 1, wherein the storage controller is configured to operate the memory device at the first read speed based on the storage device being in an idle state.

6. The storage device of claim 5, wherein based on the storage device ending a low power mode, the storage controller is configured to operate the memory device at the second read speed.

7. The storage device of claim 1, wherein the data read at the adaptively varying speed is data stored in a single-level cell area of the memory cell array.

8. The storage device of claim 1, wherein the storage controller is configured to vary a gear level for reading the data in response to a request from a host connected to the storage device.

9. A storage device comprising:
a memory device including a single-level cell area and a multi-level cell area; and
a storage controller configured to adaptively vary a gear level for reading data stored in the single-level cell area according to a state of the memory device, the state of the memory device being based on an operation state of the memory device and a transmission/reception state of the memory device.

10. The storage device of claim 9, wherein the storage controller is configured to
control a driving operation of the memory device and determine a state of the memory device;
determine whether an error has been detected in the read data and correct the error; and
adaptively vary the gear level based on the determined state or the error detection result.

11. The storage device of claim 10, wherein when the memory device is powered on and performs an open operation,
the storage controller is configured to set the gear level to a first read speed.

12. The storage device of claim 11, wherein when the open operation of the memory device is completed, the storage controller is configured to set and change the gear level to a second read speed.

13. The storage device of claim 10, wherein based on a number of errors detected in the read data exceeding an error threshold, the storage controller is configured to set the gear level to a first read speed.

14. The storage device of claim 10, wherein based on the storage device receiving a request from a host in a low power mode, the storage controller is configured to end the low power mode, and
based on the low power mode ending, the storage controller is configured to set and change the gear level to a second read mode.

15. The storage device of claim 9, wherein according to a change in the gear level, a read time required for the data read from a memory cell array of the memory device to reach a page buffer circuit is varied.

16. An operating method of a storage device, comprising:
setting a read speed at a first gear level;
reading data from a memory device at the first gear level;
changing the setting to a second gear level different from the first gear level according to a state of the memory device, the state of the memory device being based on an operation state of the memory device and a transmission/reception state of the memory device; and
reading data at the second gear level.

17. The operating method of claim 16, wherein based on an open operation of the memory device being completed,
the read speed is changed to the second gear level different from the first gear level.

18. The operating method of claim 16, wherein based on the memory device ending a low power mode,
the read speed is changed to the second gear level different from the first gear level.

19. The operating method of claim 16, wherein based on an error detected in the read data exceeding an error threshold,
the read speed is changed to the second gear level different from the first gear level.

20. The operating method of claim 16, wherein based on receiving a request from a host,
the read speed is changed to the second gear level different from the first gear level.

* * * * *